(12) United States Patent
Catabay et al.

(10) Patent No.: US 6,613,665 B1
(45) Date of Patent: Sep. 2, 2003

(54) PROCESS FOR FORMING INTEGRATED CIRCUIT STRUCTURE COMPRISING LAYER OF LOW K DIELECTRIC MATERIAL HAVING ANTIREFLECTIVE PROPERTIES IN AN UPPER SURFACE

(75) Inventors: Wilbur G. Catabay, Saratoga, CA (US); Wei-Jen Hsia, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 45 days.

(21) Appl. No.: 10/002,981

(22) Filed: Oct. 26, 2001

(51) Int. Cl.[7] .......................................... H01L 21/4763
(52) U.S. Cl. ...................... 438/636; 438/786; 438/787; 438/788; 438/798
(58) Field of Search .................. 438/636, 786–788, 438/798

(56) References Cited

U.S. PATENT DOCUMENTS

| 3,012,861 A | 12/1961 | Ling |
| 3,178,392 A | 4/1965 | Kriner |
| 3,832,202 A | 8/1974 | Ritchie |

(List continued on next page.)

OTHER PUBLICATIONS

Bothra, S., et al., "Integration of 0.25 $\mu$m Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

Primary Examiner—John F. Niebling
Assistant Examiner—Lynne A. Gurley
(74) Attorney, Agent, or Firm—John P. Taylor

(57) ABSTRACT

A process is disclosed for forming an integrated circuit structure characterized by formation of a combined dielectric layer and antireflective coating layer. The process comprises forming a layer of dielectric material over an integrated circuit structure, and treating the surface of the layer of dielectric material to form an antireflective coating (ARC) surface therein. When a layer of photoresist is then formed over the ARC surface, and the layer of photoresist is exposed to a pattern of radiation, the ARC surface improves the accuracy of the replication, in the photoresist layer, of the pattern of radiation. Preferably, the surface of the dielectric layer is treated with a plasma comprising ions of elements and/or compounds to form the ARC surface.

19 Claims, 2 Drawing Sheets

U.S. PATENT DOCUMENTS

| | | | |
|---|---|---|---|
| 3,920,865 A | 11/1975 | Laufer | |
| 4,705,725 A | 11/1987 | Glajch | |
| 4,771,328 A | 9/1988 | Malaviya | |
| 5,194,333 A | 3/1993 | Ohnaka | |
| 5,314,845 A | 5/1994 | Lee | |
| 5,364,800 A | 11/1994 | Joyner | |
| 5,376,595 A | 12/1994 | Zupancic | |
| 5,470,801 A | 11/1995 | Kapoor | |
| 5,559,367 A | 9/1996 | Cohen | |
| 5,675,187 A | 10/1997 | Numata | |
| 5,688,724 A | 11/1997 | Yoon | |
| 5,759,746 A * | 6/1998 | Azuma et al. | 430/313 |
| 5,847,461 A | 12/1998 | Xu et al. | |
| 5,858,879 A | 1/1999 | Chao | |
| 5,864,172 A | 1/1999 | Kapoor et al. | |
| 5,874,367 A | 2/1999 | Dobson | 438/787 |
| 5,874,745 A | 2/1999 | Kuo | |
| 5,882,489 A | 3/1999 | Bersin | |
| 5,904,154 A | 5/1999 | Chien | |
| 5,915,203 A | 6/1999 | Sengupta | |
| 5,930,655 A | 7/1999 | Cooney, III | |
| 5,939,763 A | 8/1999 | Hao | |
| 5,989,998 A | 11/1999 | Sugahara | |
| 6,025,263 A | 2/2000 | Tsai | |
| 6,028,015 A | 2/2000 | Wang et al. | |
| 6,037,248 A | 3/2000 | Ahn | |
| 6,043,145 A | 3/2000 | Suzuki et al. | |
| 6,043,167 A | 3/2000 | Lee | |
| 6,051,477 A | 4/2000 | Nam | |
| 6,054,379 A | 4/2000 | Yau | |
| 6,063,702 A | 5/2000 | Chung | |
| 6,066,574 A | 5/2000 | You | |
| 6,114,259 A | 9/2000 | Sukharev et al. | |
| 6,133,145 A * | 10/2000 | Chen | 438/636 |
| 6,147,012 A | 11/2000 | Sukharev et al. | |
| 6,177,302 B1 | 1/2001 | Yamazaki | |
| 6,204,192 B1 | 3/2001 | Zhao et al. | |
| 6,215,087 B1 | 4/2001 | Akahori et al. | |
| 6,232,658 B1 | 5/2001 | Catabay et al. | |
| 6,303,047 B1 | 5/2001 | Catabay et al. | |
| 6,245,666 B1 | 6/2001 | Ko et al. | |
| 6,287,959 B1 * | 9/2001 | Lyons et al. | 438/636 |
| 6,309,970 B1 * | 10/2001 | Ito et al. | 438/687 |
| 6,348,405 B1 * | 2/2002 | Ohuchi | 438/636 |
| 6,407,013 B1 * | 6/2002 | Li et al. | 438/788 |
| 6,465,372 B1 * | 10/2002 | Xia et al. | 438/787 |
| 6,528,116 B1 * | 3/2003 | Pokharna et al. | 438/787 |

* cited by examiner

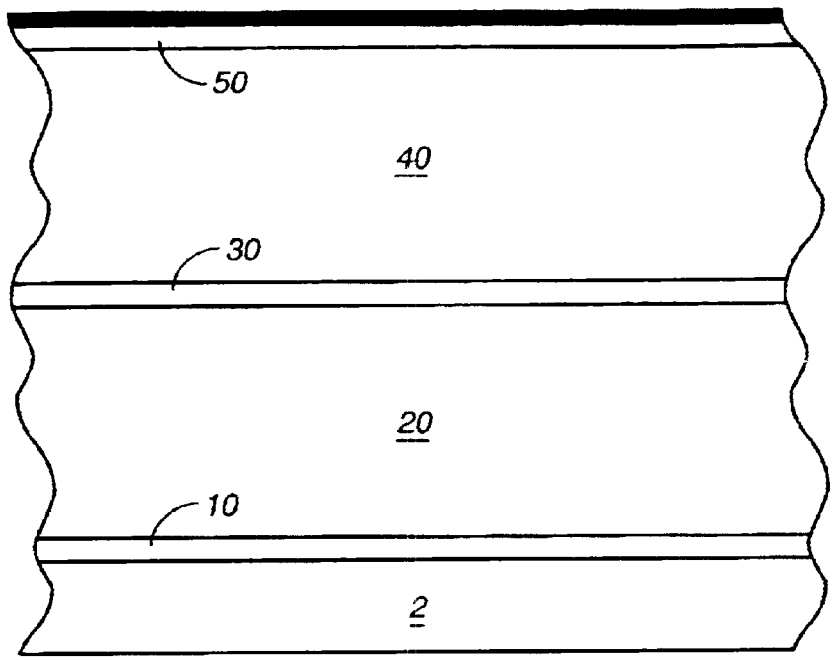
FIG._1
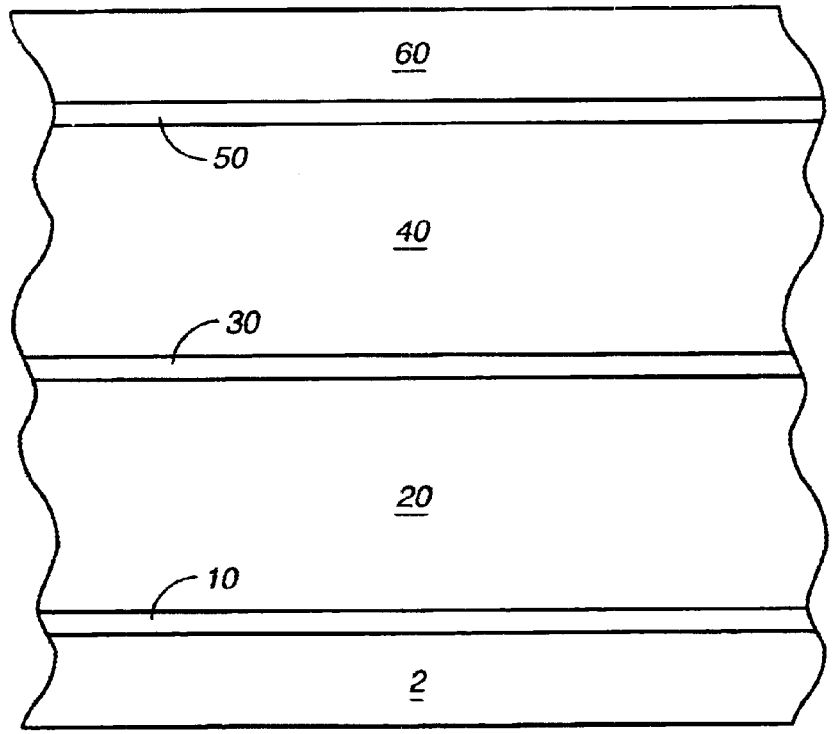
FIG._2

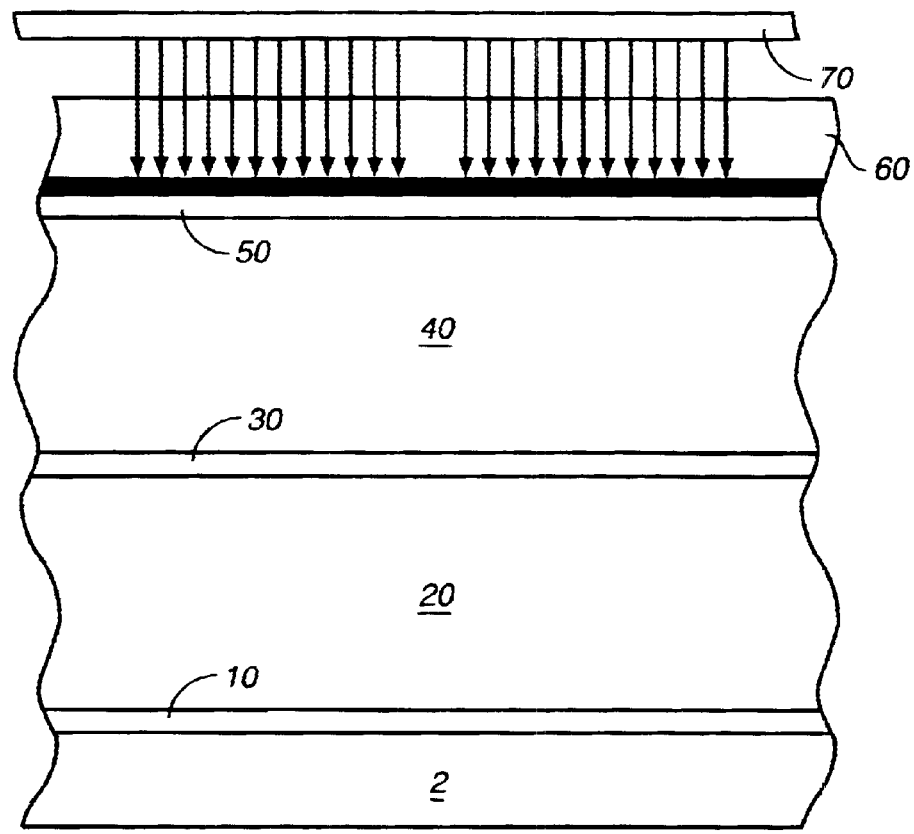
FIG._3
FIG._4

PROCESS FOR FORMING INTEGRATED CIRCUIT STRUCTURE COMPRISING LAYER OF LOW K DIELECTRIC MATERIAL HAVING ANTIREFLECTIVE PROPERTIES IN AN UPPER SURFACE

BACKGROUND OF THE INVENTION

1. Field of the Invention

This invention relates to the formation of integrated circuit structures. More particularly this invention relates to a process for forming a layer of dielectric material, preferably low k dielectric material, for an integrated circuit structure wherein an antireflective coating (ARC) is formed in an upper surface of the layer of dielectric material.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance. In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture.

The above-mentioned shrinking of integrated circuits and the concurrent ever increasing demands for faster speeds, has also resulted in renewed interest in the use of copper as a filler material for vias and contact openings instead of tungsten, as well as for use in metal lines instead of aluminum because of the well known low electrical resistance of copper, compared to either aluminum or tungsten.

However, there are negative aspects to the choice of copper for via filling or in the formation of metal lines. Copper layers deposited over an integrated circuit structure cannot be easily patterned using a photoresist mask as can layers of aluminum or tungsten. As a result, copper-filled trenches and vias are formed by the damascene process wherein a layer (or layers) of dielectric material such as the aforementioned low k dielectric material is first formed over the integrated circuit structure, following which trench and via openings are formed in the dielectric material, and then the openings are filled with copper.

However, the resulting required trench and via lithography becomes complicated when conventional spin-on organic materials are used to form the antireflective coating (ARC) on the already formed integrated circuit structure required for accuracy of the lithography process used for patterning the subsequent layers of the integrated circuit structure. This is due to the process limitations of the reflective organic materials used as antireflective coatings. Problems associated with the organic films include particle generation, step coverage and trench fill for damascene applications. While inorganic materials could be used instead of such organic ARC materials, it would be more desirable to eliminate the formation and use of an additional layer solely as an ARC layer, since this requires additional steps and sometimes the use of addition apparatus (tools) requiring transfers of the substrate back and forth between different apparatus.

SUMMARY OF THE INVENTION

A process is provided for forming an integrated circuit structure characterized by formation of a combined dielectric layer and antireflective coating layer which comprises forming a layer of dielectric material over an integrated circuit structure, and treating the surface of the layer of dielectric material to form an antireflective coating (ARC) surface therein.

When a layer of photoresist is formed over the ARC surface, and the layer of photoresist is exposed to a pattern of radiation, the ARC surface improves the accuracy of the replication, in the photoresist layer, of the pattern of radiation. Preferably, the layer of dielectric material is a layer of low k dielectric material, and the surface of the dielectric layer is treated with a plasma comprising ions of elements and/or compounds.

BRIEF DESCRIPTION OF THE DRAWINGS

FIG. 1 is a fragmentary vertical cross-section view of a dual damascene structure in the top surface of which is formed an antireflective coating (ARC) layer by the process of the invention.

FIG. 2 is a fragmentary vertical cross-section view of the dual damascene structure of FIG. 1 with a photoresist layer formed thereon FIG. 3 is a fragmentary vertical cross-section view of the dual damascene structure of FIG. 2 with a radiation image being projected onto the photoresist layer through a reticle, with the antireflective coating (ARC) layer formed by the process of the invention inhibiting the reflection of the radiation back through the photoresist layer.

FIG. 4 is a flowsheet of the process of the invention.

DETAILED DESCRIPTION OF THE INVENTION

The process of the invention forms an integrated circuit structure characterized by formation of a combined dielectric layer and antireflective coating by forming a layer of dielectric material over an integrated circuit structure, and treating the upper surface of the layer of dielectric material to form an antireflective coating (ARC) layer therein. When a layer of photoresist is formed over the resulting ARC surface, and the layer of photoresist is exposed to a pattern of radiation, the ARC surface improves the accuracy of the replication, in the photoresist layer, of the pattern of radiation. Preferably, the layer of dielectric material is a layer of low k dielectric material, and the surface of the dielectric layer is treated with a plasma comprising ions of elements and/or compounds to form the ARC coating therein.

Turning now to FIG. 1, an integrated circuit structure is generally shown at 2 which may, for example, comprise a lower level of metal interconnects. A barrier layer 10, typically comprising a dielectric material, is formed over integrated circuit structure 2 to protect the dielectric material to be formed over barrier layer 10 from underlying integrated circuit structure 2. Over barrier layer 10 is formed a first layer 20 of dielectric material, preferably low k dielectric material. Typically the vias of dual damascene structures are formed in this first layer of dielectric material which will hereinafter be referred to as a layer of low k dielectric material.

First low k dielectric layer 20 may comprise a carbon-doped silicon oxide dielectric material, formed as the reaction product of an oxidizing agent, such as, for example, $O_2$, $O_3$, NO, $NO_2$, or $H_2O_2$, or mixtures of same and an organo-substituted silane. Such a low k carbon-doped silicon oxide dielectric material, for example, may be formed using methyl silane ($CH_3SiH_3$), as described in the previously referenced Peters article. Alternatively, the low k carbon-doped silicon oxide dielectric material may also comprise, for example, the reaction product of an oxidizing agent with a multiple carbon-substituted silane such as described in U.S. Pat. No. 6,303,047, issued Oct. 16, 2001, and assigned to the assignee of this invention, the subject matter of which is hereby incorporated by reference. The low k carbon-doped silicon oxide dielectric material might also comprise the reaction product of an oxidizing agent and an organofluoro silane such as described in U.S. Pat. No. 6,365,528, issued Apr. 2, 2002 and in Ser. Nos. 09/792,683; 09/792,685; and 09/792,691; all filed on Feb. 23, 2001. All four of these cases are assigned to the assignee of this application, and the subject matter of all four cases is hereby incorporated by reference. Other commercially available carbon-doped silicon oxide low k dielectric materials which may used in the formation of low k dielectric layer 20 include Coral, available from Novellus; Black Diamond, available from Applied Materials; and Orion, available from Trikon. Typically the thickness of first low k dielectric layer 20 will range from about 300 nanometers (nm) to about 600 nm.

Over first low k dielectric layer 20 is formed an etch stop layer 30 which is conventionally formed from a material having different etch characteristics than low k dielectric layer 20 such as, for example, silicon nitride or silicon carbide. Typically the thickness of etch stop layer 30 will range from about 25 nm to about 75 nm.

A second low k dielectric layer 40 is formed over etch stop layer 30. As is customary in the formation of dual damascene structures, second low k dielectric layer 40 may comprise the same material as used for first low k dielectric layer 20. The pattern of trenches which, when filled with metal, will become the metal interconnects, are conventionally formed in this second or upper dielectric layer of dual damascene structures. Typically the thickness of second low k dielectric layer 40 will range from about 200 nm to about 500 nm.

In accordance with the invention, in the upper surface of second low k dielectric layer 40 is formed antireflective coating (ARC) surface 50. Although the antireflective surface 50 in the upper surface of second low k dielectric layer 40 is shown as a separate coating or layer in FIGS. 1–3, it will be understood, that this is for illustrative purposes only. In accordance with the process of the invention, the upper surface of second low k dielectric layer 40 is treated with a plasma to alter or modify the reflective properties of the upper surface of layer 40 to cause it to function as an antireflective coating (ARC) layer. It will, therefore, be understood that any reference herein to ARC layer 50 in the description and drawings is intended to refer to this alteration of the upper surface of second low k dielectric layer 40, rather than a separate coating formed over the surface of layer 40.

The surface alteration or treatment of the upper surface of layer 40 to form ARC surface 50 is carried out in a plasma reactor using a plasma of elements or compounds such as, for example, a plasma of $H_2$, He, Ar, $NH_3$, or $N_2$, or mixtures of same. The plasma power used may range from about 200 watts to about 1000 watts and will be somewhat dependent upon the size of the substrate being treated, as well as the extent of the treatment, as will be discussed.

The pressure in the plasma reactor during the treatment will be maintained in a range of from about 500 millitorr (mtorr) to about 1000 mtorr during the surface treatment, while the substrate temperature should be maintained within a range of from about 100° C. to about 400° C. The treatment should be carried out for a period ranging from about 30 seconds to about 300 seconds.

Optionally, during the treatment, a separate (second) rf bias may be applied directly to the substrate if needed. When such a separate bias is applied to the substrate, the power level of such a second rf source should not exceed about 500 watts. All of the reaction parameters, including any such additional bias, if used, should be adjusted to provide the minimum depth needed to achieve the desired n and k values of reflectance in surface 50 of layer 40. Any thicknesses of the surface treatment in excess of such depth may be detrimental since the plasma treatment of the invention may have an adverse effect on the dielectric constant of low k dielectric layer 40 if the depth of the plasma treatment of the invention in layer 40 becomes excessive. The result of such treatment of the upper surface of low k dielectric layer 40 should be a swing curve (reflectance as ordinate plotted against ARC thickness as abscissa) which is both low and flat.

After formation of ARC surface 50 in layer 40, a photoresist mask 60 is formed over ARC surface 50, as shown in FIG. 2. The thickness of resist layer 60 will depend upon the thickness of the layer(s) to be etched and the particular etch system to be used, as is well known to those skilled in the art.

After formation of resist layer 60 over ARC surface 50, resist layer 60 is exposed to a pattern of radiation, such as UV light, through a reticle 70, as shown in FIG. 3, to form a via mask which will be used to form a via opening down to and through first low k dielectric layer 20. As is well known to those skilled in the art, exposed resist mask 60 is, after the radiation exposure step, baked to harden exposed portions of the resist mask 60 (when negative photoresist is used as illustrated in FIG. 3), and then exposed to a developer to remove the unexposed portions of the resulting resist mask 60.

At this point the resist mask can be examined, using CD SEM and cross section SEM, to determine whether or not ARC surface 50 satisfactorily functioned to prevent radiation reaching ARC surface 50 from being reflected back through resist layer 60 adjacent the via mask openings which undesired reflection would be evident as a reduced diameter of the via mask openings in resist layer 60.

Alternatively, if desired, vias may be etched in second low k dielectric layer 40 and first low k dielectric layer 20 before such examination. The resultant via openings would then be examined by CD SEM and cross section SEM to determine whether or not ARC surface 50 functioned as desired. In either case, the process parameters for treating the upper surface of layer 40 to form ARC surface 50 could then be adjusted (if ARC surface 50 was not functioning properly) to empirically determine the optimum parameters for the treatment of the upper surface of layer 40 to form ARC surface 50.

Thus, the invention comprises an improvement in the process to form integrated circuit structures wherein the second low k dielectric layer (which functions as an upper dielectric layer of a dual damascene structure in which trenches are formed for eventual filling with copper to form copper metal interconnects) may also function as an ARC surface to ensure more accurate photolithography for the subsequent formation of the via and trench resist masks to be used in the formation of the dual damascene structure.

Having thus described the invention what is claimed is:

1. A process for forming an integrated circuit structure characterized by formation of a combined low k dielectric layer and antireflective coating layer which comprises:
  a) forming a layer of low k silicon dioxide dielectric material over an integrated circuit structure on a semiconductor substrate; and
  b) treating the upper surface of said layer of low k dielectric material with a plasma to modify the reflective properties of said upper surface of said low k dielectric layer to cause it to function as an antireflective coating (ARC) surface;

whereby said ARC surface improves the accuracy of the replication, in a photoresist layer formed over said ARC surface, of a pattern of radiation to which said photoresist layer is exposed.

2. The process of claim 1 wherein said step of treating the surface of said layer of low k dielectric material to form an ARC surface therein further comprises treating said surface of said layer of low k dielectric material with a plasma comprising ions and elements to form said ARC surface on said layer of low k dielectric material.

3. A The process of claim 2 wherein said plasma comprises ions of elements and compounds selected from the group consisting of $H_2$, He, Ar, $NH_3$, and $N_2$.

4. The process of claim 2 wherein said plasma operates at a power which ranges from about 200 watts to about 1000 watts.

5. The process of claim 2 wherein said plasma treatment is carried out in a reactor maintained at a pressure of from about 500 mtorr to about 10 torr during said treatment.

6. The process of claim 2 wherein said plasma treatment is carried out while maintaining said semiconductor substrate within a temperature range of from about 100° C. to about 400° C.

7. The process of claim 2 wherein said plasma treatment is carried out for a time period ranging from about 30 seconds to about 300 seconds.

8. The process of claim 2 wherein said plasma treatment is carried out while maintaining on said semiconductor substrate a separate rf bias not exceeding about 500 watts.

9. A process for forming an integrated circuit structure characterized by formation of a low k dielectric layer having an upper surface thereon comprising an antireflective coating which comprises:
  a) forming a layer of low k silicon dioxide dielectric material over an integrated circuit structure on a semiconductor substrate;
  b) treating the upper surface of said layer of low k dielectric material with a plasma to modify the reflective properties of said upper surface of said low k dielectric layer to cause it to function as an antireflective coating (ARC) surface;
  c) forming a layer of photoresist over said ARC surface; and
  d) exposing said layer of photoresist to a pattern of radiation using said ARC surface to improve the accuracy of the replication, in said photoresist layer, of said pattern of radiation.

10. The process of claim 9 wherein said plasma comprises ions of elements and compounds.

11. The process of claim 10 wherein said plasma comprises ions of elements and compounds selected from the group consisting of $H_2$, He, Ar, $NH_3$, and $N_2$.

12. The process of claim 10 wherein said plasma operates at a power which ranges from about 500 watts to about 1000 watts.

13. The process of claim 10 wherein said plasma treatment is carried out in a reactor maintained at a pressure of from about 500 mtorr to about 10 torr during said treatment.

14. The process of claim 10 wherein said plasma treatment is carried out while maintaining said semiconductor substrate within a temperature range of from about 100° C. to about 400° C.

15. The process of claim 10 wherein said plasma treatment is carried out for a time period ranging from about 30 seconds to about 300 seconds.

16. The process of claim 10 wherein said plasma treatment is carried out while maintaining on said semiconductor substrate a separate rf bias not exceeding about 500 watts.

17. A process for forming an integrated circuit structure characterized by formation of a combined low k dielectric layer and antireflective coating layer which comprises:
  a) forming a layer of low k dielectric material over an integrated circuit structure on a semiconductor substrate;
  b) treating the surface of said layer of low k dielectric material with a plasma to form an antireflective coating (ARC) surface therein;
  c) forming a layer of photoresist over said ARC surface; and
  d) exposing said layer of photoresist to a pattern of radiation;

whereby said ARC surface improves the accuracy of the replication, in said photoresist layer formed over said ARC surface, of said pattern of radiation to which said photoresist layer is exposed.

18. The process of claim 17 wherein said plasma treatment is carried out for a time period ranging from about 30 seconds to about 300 seconds at a plasma power which ranges from about 200 watts to about 1000 watts in a reactor maintained at a pressure of from about 500 mtorr to about 10 torr during said treatment while maintaining said semiconductor substrate within a temperature range of from about 100° C. to about 400° C.

19. A process for forming an integrated circuit structure characterized by formation of a combined low k carbon-doped silicon oxide dielectric layer and an antireflective coating on the surface of said dielectric layer which comprises:
  a) forming a layer of low k carbon-doped silicon oxide dielectric material over an integrated circuit structure on a semiconductor substrate;
  b) treating the surface of said layer of low k carbon-doped silicon oxide dielectric material for a time period ranging from about 30 seconds to about 300 seconds with a plasma at a plasma power which ranges from about 200 watts to about 1000 watts in a reactor maintained at a pressure of from about 500 mtorr to about 10 torr during while maintaining said semiconductor substrate in said reactor within a temperature range of from about 100° C. to about 400° C. to modify the reflective properties of said upper surface of said low k carbon-doped silicon oxide dielectric layer to cause it to function as an antireflective coating (ARC) surface;

c) forming a layer of photoresist over said ARC surface; and d) exposing said layer of photoresist to a pattern of radiation;

whereby said ARC surface improves the accuracy of the replication, in said photoresist layer formed over said ARC surface, of said pattern of radiation to which said photoresist layer is exposed.

* * * * *